(12) United States Patent
Ng (10) Patent No.: US 11,384,193 B2
(45) Date of Patent: Jul. 12, 2022

(54) HYDROPHOBIC PINNING MAT FOR DIRECTED SELF-ASSEMBLY OF DIBLOCK COPOLYMER NOVEL COMPOSITIONS AND PROCESSES FOR SELF-ASSEMBLY OF BLOCK COPOLYMERS

(71) Applicant: Merck Patent GmbH, Darmstadt (DE)

(72) Inventor: Edward W. Ng, Belle Mead, NJ (US)

(73) Assignee: Merck Patent GmbH, Darmstadt (DE)

( * ) Notice: Subject to any disclaimer, the term of this patent is extended or adjusted under 35 U.S.C. 154(b) by 220 days.

(21) Appl. No.: 16/985,673

(22) Filed: Aug. 5, 2020

(65) Prior Publication Data

US 2021/0230339 A1  Jul. 29, 2021

Related U.S. Application Data

(60) Provisional application No. 62/898,212, filed on Sep. 10, 2019.

(51) Int. Cl.
*C08F 299/02* (2006.01)
*C08F 212/08* (2006.01)
(Continued)

(52) U.S. Cl.
CPC ........ *C08F 299/024* (2013.01); *C08F 212/08* (2013.01); *C08F 220/14* (2013.01); *C08J 5/18* (2013.01); *G03F 7/0002* (2013.01)

(58) Field of Classification Search
CPC .... C08F 212/08; C08F 212/22; C08F 212/12; C08F 212/32; C08F 212/24; C08F 220/325
See application file for complete search history.

(56) References Cited

U.S. PATENT DOCUMENTS

2010/0283164 A1* 11/2010 Pinchuk ............... A61F 2/1635
264/1.32
2013/0078576 A1* 3/2013 Wu ....................... C08F 293/00
430/296

* cited by examiner

*Primary Examiner* — Mark S Kaucher
(74) *Attorney, Agent, or Firm* — Francis M. Houlihan

(57) ABSTRACT

The present invention relates to a novel styrenic polymer comprised of the repeat units of structures (I), (II), and (III), wherein $R_1$, $R_2$ and $R_3$ are individually selected from H or a C-1 to C-4 linear alkyl, $R_5$, $R_7$ and $R_6$ are individually selected from a C-1 to C-8 linear alkyl, a C-3 to C-8 linear alkyl and a C-3 to C-8 cyclic alkyl and to the novel composition comprised of this polymer and a spin on organic solvent. In another aspect of this invention it pertains to the use of this composition to create a grafted on a substrate, and a further aspect, this grafted film may be used in a directed self-assembly process.

(Continued)

-continued

19 Claims, 3 Drawing Sheets (51) Int. Cl.
G03F 7/00 (2006.01)
C08J 5/18 (2006.01)
C08F 220/14 (2006.01)

HYDROPHOBIC PINNING MAT FOR DIRECTED SELF-ASSEMBLY OF DIBLOCK COPOLYMER NOVEL COMPOSITIONS AND PROCESSES FOR SELF-ASSEMBLY OF BLOCK COPOLYMERS

This application claims priority to U.S. Provisional Patent Application No. 62/898,212, filed Sep. 10, 2019, the contents of each of which are being hereby incorporated herein by reference.

FIELD OF INVENTION

The invention relates to novel styrenic polymers, novel compositions and novel methods for using the novel compositions for aligning microdomains of directed self-assembling block copolymers (BCP). The compositions and processes are useful for fabrication of electronic devices.

BACKGROUND

Directed self-assembly of block copolymers is a method useful for generating smaller and smaller patterned features for the manufacture of microelectronic devices in which the critical dimensions (CD) of features on the order of nanoscale can be achieved. Directed self-assembly methods are desirable for extending the resolution capabilities of microlithographic technology. In a conventional lithography approach, ultraviolet (UV) radiation may be used to expose through a mask onto a photoresist layer coated on a substrate or layered substrate. Positive or negative photoresists are useful, and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. The need for large-scale integration has led to a continued shrinking of the circuit dimensions and features in the devices. In the past, the final resolution of the features has been dependent upon the wavelength of light used to expose the photoresist, which has its own limitations. Direct assembly techniques, such as graphoepitaxy and chemoepitaxy using block copolymer imaging, are highly desirable techniques used to enhance resolution while reducing CD variation. These techniques can be employed to either enhance conventional UV lithographic techniques or to enable even higher resolution and CD control in approaches employing EUV, e-beam, deep UV or immersion lithography. The directed self-assembly block copolymer comprises a block of etch resistant copolymeric unit and a block of highly etchable copolymeric unit, which when coated, aligned and etched on a substrate give regions of very high-density patterns. In the graphoepitaxy directed self-assembly method, the block copolymers self organizes around a substrate that is pre-patterned with conventional lithography (e.g., Ultraviolet, Deep UV, e-beam, Extreme UV (EUV) exposure source) to form repeating topographical features such as a line/space (L/S) or contact hole (CH) pattern. In an example of a L/S directed self-assembly array, the block copolymer can form self-aligned lamellar regions which can form parallel line-space patterns of different pitches in the trenches between pre-patterned lines, thus enhancing pattern resolution by sub-dividing the space in the trench between the topographical lines into finer patterns. For example, a diblock copolymer which is capable of microphase separation and comprises a block rich in carbon (e.g., styrene or containing some other element like Si, Ge, Ti) which is resistant to plasma etch, and a block which is highly plasma etchable or removable, can provide a high-resolution pattern definition. Examples of highly etchable blocks can comprise monomers which are rich in oxygen and which do not contain refractory elements and are capable of forming blocks which are highly etchable, such as methylmethacrylate. The plasma etching gases used in the etching process of defining the self-assembly pattern typically are those used in processes employed to make integrated circuits (IC). In this manner very fine patterns can be created in typical IC substrates than were definable by conventional lithographic techniques, thus achieving pattern multiplication. Similarly, features such as contact holes can be made denser by using graphoepitaxy in which a suitable block copolymer arranges itself by directed self-assembly around an array of contact holes or posts defined by conventional lithography, thus forming a denser array of regions of etchable and etch resistant domains which when etched give rise to a denser array of contact holes. Consequently, graphoepitaxy has the potential to offer both pattern rectification and pattern multiplication.

In chemical epitaxy or pinning chemical epitaxy (a.k.a. chemoepitaxy) the self-assembly of the block copolymer is formed around a surface that has regions of differing chemical affinity but no or very slight topography to guide the self-assembly process. For example, the surface of a substrate could be patterned with conventional lithography (e.g., UV, Deep UV, e-beam EUV) to create surfaces of different chemical affinity in a line and space (L/S) pattern in which exposed areas whose surface chemistry had been modified by irradiation alternate with areas which are unexposed and show no chemical change. These areas present no topographical difference but do present a surface chemical difference or pinning to direct self-assembly of block copolymer segments. Specifically, the directed self-assembly of a block copolymer whose block segments contain etch resistant (such as styrene repeat unit) and rapidly etching repeat units (e.g., methyl methacrylate repeat units) would allow precise placement of etch resistant block segments and highly etchable block segments over the pattern. This technique allows for the precise placement of these block copolymers and the subsequent pattern transfer of the pattern into a substrate after plasma or wet etch processing. Chemical epitaxy has the advantage that it can be fined tuned by changes in the chemical differences to help improve line edge roughness and CD control, thus allowing for pattern rectification. Other types of patterns such as repeating contact holes (CH) arrays could also be pattern rectified using chemoepitaxy.

Neutral layers are layers on a substrate, or the surface of a treated substrate, which have no affinity for either of the block segment of a block copolymer employed in directed self-assembly. In the graphoepitaxy method of directed self-assembly of block copolymer, neutral layers are useful as they allow the proper placement or orientation of block polymer segments for directed self-assembly which leads to proper placement of etch resistant block polymer segments and highly etchable block polymer segments relative to the substrate. For instance, in surfaces containing line and space features which have been defined by conventional radiation lithography, a neutral layer allows block segments to be oriented so that the block segments are oriented perpendicular to the surface of the substrates, an orientation which is ideal for both pattern rectification and pattern multiplication depending on the length of the block segments in the block copolymer as related to the length between the lines defined by conventional lithography. If a substrate interacts too strongly with one of the block segments it would cause it to lie flat on that surface to maximize the surface of contact between the segment and the substrate; such a surface would perturb the desirable perpendicular alignment which can be used to either achieve pattern rectification or pattern multiplication based on features created through conventional lithography. Modification of selected small areas or pinning of substrate to make them strongly interactive with one block of the block copolymer and leaving the remainder of the surface coated with the pinning layer can be useful for forcing the alignment of the domains of the block copolymer in a desired direction, and this is the basis for the pinned chemoepitaxy or graphoepitaxy employed for pattern multiplication.

Compositions containing standard crosslinking styrenic pinning layer materials work effectively for oxide and nitride substrates such as SiOx and SiN. However, for SiBARC (i.e., silicon containing bottom antireflective coating) substrates, standard styrenic pinning layer compositions, when coated and crosslinked, show de-wetting defects on these types of hydrophobic substrates, which leads to defects in subsequent DSA processes. There is a need to develop a new crosslinkable hydrophobic mat material suitable specifically for SiBARC substrate. This invention discloses an improved version of crosslinkable styrenic polymer which is compatible with SiARC as well as SiOx and SiN substrates.

SUMMARY OF THE INVENTION

One aspect of this is invention is novel polymers comprised of the repeat units of structures (I), (II), and (III), wherein $R_1$, $R_2$ and $R_3$ are each independently selected from H or a C-1 to C-4 linear alkyl, $R_5$, $R_7$ and $R_6$ are each independently selected from a C-1 to C-8 linear alkyl, a C-3 to C-8 linear alkyl and a C-3 to C-8 cyclic alkyl. Another aspect of this invention are novel compositions comprised of said polymers and an organic spin casting solvent. Yet another aspect of this invention is the use of said compositions in a directed self-assembly process for a block copolymer wherein said compositions are coated on a substrate to define a pinning layer in this process.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one," and the use of "or" means "and/or," unless specifically stated otherwise. Furthermore, the use of the term "including," as well as other forms such as "includes" and "included," is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated references and similar materials defines a term in a manner that contradicts the definition of that term in this application, this application controls.

Herein, "alkyl" refers to hydrocarbon groups which can be linear, branched (e.g., methyl, ethyl, propyl, isopropyl, tert-butyl and the like) or cyclic (e.g., cyclohexyl, cyclopropyl, cyclopentyl and the like).

"Alkyloxy" refers to an alkyl group as defined above on which is attached through an oxy (—O—) moiety (e.g., methoxy, ethoxy, propoxy, butoxy, 1,2-isopropoxy, cyclopentyloxy cyclohexyloxy and the like).

"Fluoroalkyl" refers to a linear, cyclic or branched saturated alkyl group as defined above in which the hydrogens have been replaced by fluorine either partially or fully (e.g., trifluoromethyl, perfluoroethyl, 2,2,2-trifluoroethyl, perfluoroisopropyl, perfluorocyclohexyl and the like).

"Fluoroalkyloxy" refers to a fluoroalkyl group as defined above on which is attached through an oxy (—O—) moiety (e.g., trifluoromethoxy, perfluoroethyloxy, 2,2,2-trifluoroethoxy, perfluorocyclohexyloxy and the like).

Herein when referring to an alkyl, alkyloxy, fluoroalkyl, fluoroalkyloxy moieties with a possible range carbon atoms which starts with C-1 such as for instance "C-1 to C-10 alkyl," or "C-1 to C-10 fluoroalkyl," as a non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term "alkylene" refers to hydrocarbon groups which can be a linear, branched or cyclic which has two attachment points (e.g., methylene, ethylene, 1,2-isopropylene, a 1,4-cyclohexylene and the like). Here again, when designating a possible range of carbons, such as C-1 to C-20, as a non-limiting example, this range encompasses linear alkylenes starting with C-1 but only designates branched alkylenes, or branched cycloalkylene starting with C-3. The term alkylene also encompasses unsubstituted alkylene (a.k.a. linear branched or cyclic alkylene with only hydrogen present), and substituted alkylenes (a.k.a. linear branched or cyclic alkylenes containing these substituents other than hydrogen), wherein these substituted alkylenes are ones wherein one or more hydrogens is replaced by a substituent selected from an aryl group, a halide, a C-1 to C-20 alkyl, or a C-1 to C-20 alkyloxy.

Herein the term "aryl" refers to aromatic hydrocarbon moiety which has one attachment points, this moiety may be a single benzene moiety (e.g., phenyl), a polycyclic aromatic moiety with one attachment points such derived from naphthalene, anthracene, pyrene and the like, or a multiple benzene rings in a chain which have one attachment point (e.g., 1,4-biphenyl). The term "aryl" also encompasses the aforementioned moieties which are unsubstituted aryls (a.k.a. only hydrogen as substituents) or which are substituted aryls, wherein the substituent is a substituent selected from a halide, a C-1 to C-20 alkyl, or a C-1 to C-20 alkyloxy.

Herein the term "arylene" refers to aromatic hydrocarbon moiety which has two attachment points, this moiety may be a single benzene moiety (e.g., 1,4-phenylene, 1,3-phenylene and 1,2-phenylene), a polycyclic aromatic moiety with two attachment points such derived from naphthalene, anthracene, pyrene and the like, or a multiple benzene rings in a chain which have two attachment point (e.g., biphenylene).

"Lo" is the block copolymer, bulk repeat period, as defined in Erik W. Edwards et. al., Macromolecules 2007, 40, p 90-96.

If two linking moieties are adjacent to each other and both are designated as a single valence bond this designation represents a single linking moiety which is a single valence bond (e.g., if linking moieties $L_1$ and $L_2$ are both designated as a single valence bonds, this represents a single linking moiety which is a single valence bond).

One aspect of this invention is a novel polymer comprised of the repeat units of structures (I), (II), and (III), wherein $R_1$, $R_2$ and $R_3$ are each independently selected from H or a C-1 to C-4 linear alkyl, $R_5$, $R_7$ and $R_6$ are each independently selected from a C-1 to C-8 linear alkyl, a C-3 to C-8 linear alkyl, and a C-3 to C-8 cyclic alkyl.

In one embodiment of said repeat unit of structure (III), it is one wherein for said moieties $R_5$, $R_7$, and $R_6$, any two these moieties may be attached to each other, forming a single C-6 to C-24 alkylcycloalkan-1-yl, or alternatively, all three of these may be linked together to form a C-6 to C-24 tertiary alicyclic moiety. Non-limiting examples of said alkylcycloalkan-1-yl are ethylcyclohexan-1-yl, methylcyclopentan-1-yl, and the like, and non-limiting examples of said tertiary alicyclic moieties are adamantan-1-yl, bicyclo[2.2.1]heptan-1-yl, alkylcyclohexan-1-yl moieties, and the like.

In one embodiment of said novel polymer each polymer chain of said polymer contains one hydrogen end group and one end group having structure (IV), wherein $R_8$ and $R_9$ are each independently selected from a C-1 to C-8 linear alkyl, a C-3 to C-8 branched alkyl and a C-3 to C-8 cyclic alkyl and X is CN or a carbonyloxyalkyl of structure (—C(=O)—O—$R_{10}$), wherein $R_{10}$ is selected from a C-1 to C-8 linear alkyl, a C-3 to C-8 branched alkyl and a C-3 to C-8 cyclic alkyl, wherein * designates the attachment point of said end group of structure (IV) to said polymer chain.

(IV)

In another embodiment of said novel polymer, $R_1$, $R_2$ and $R_3$ are H.

In another embodiment of said novel polymer, $R_5$, $R_6$ and $R_7$ are each independently selected from a C-1 to C-8 linear alkyl, a C-3 to C-8 linear alkyl and a C-3 to C-8 cyclic alkyl.

In another embodiment of said novel polymer $R_5$, $R_6$ and $R_7$ are each independently selected from a C-1 to C-8 linear alkyl, in one aspect of this embodiment, $R_5$, $R_6$ and $R_7$ are —$CH_3$.

In another embodiment of said novel polymer said end group of structure (IV) is one wherein X is CN.

In another embodiment of said novel polymer said end group of structure (IV) is one wherein X is CN and $R_8$ and $R_9$ are each independently selected from a C-1 to C-8 linear alkyl.

In another embodiment of said novel polymer, said end group of structure (IV) is one wherein X is CN and $R_8$ and $R_9$ are methyl.

In another embodiment of said novel polymer the individual mole % values based on the total moles of repeat units for the repeat units of structures (I), (II) and (III) are as follows;
 the repeat unit of structures (I) ranges from about 1 mole % to about 15 mole %,
 the repeat unit of structure (II) ranges from about 5 mole % to about 30 mole %,
 the repeat unit of structure (III) ranges from about 75 mole % to about 90 mole %,
 wherein the sum of the mole % values of the repeat units of structure (I), (II) and (III) add up to 100 mole % of the total moles of repeat units.

In another embodiment of said novel polymer the individual mole % values based on
 the total moles of repeat units for the repeat units of structures (I), (II) and (III) are as follows;
 the repeat unit of structures (I) ranges from about 5 mole % to about 10 mole %,
 the repeat unit of structure (II) ranges from about 7 mole % to about 15 mole %,
 the repeat unit of structure (III) ranges from about 80 mole % to about 87 mole %,
 wherein the sum of the mole % values of the repeat units of structure (I), (II) and (III) add up to 100 mole % of the total moles of repeat units.

In one embodiment, said novel polymer has a weight-averaged molecular weight ($M_w$) in the range of about 3,000 to about 500,000 g/mol, or in another embodiment of about 5,000 to about 200,000, or in another embodiment from about 10,000 to about 150,000 or in another embodiment in the range of about 15,000 to about 100,000, or in another embodiment in the range of about 15,000 to about 50,000, or in another embodiment in the range of about 15,000 to about 35,000, or in another embodiment in the range of about 15,000 to about 30,000.

In one embodiment, said novel polymer has a polydispersity (PDI) ($M_w/M_n$) ranges from about 1.5 to about 8, or about 1.5 to about 4, or about 1.5 to about 3.0 or about 1.5 to about 2.0, or about 1.6 to about 1.9. Molecular weight, both $M_w$ and $M_n$, can be determined by, for example, gel permeation chromatography using a universal calibration method, calibrated to polystyrene standards.

Another aspect of this invention is novel compositions comprised of said novel polymers and an organic spin casting solvent.

In another aspect, said novel compositions, may comprise further additives as components such as surfactants, levelling agents, stabilizers, and the like.

In the above embodiments of the novel compositions, the organic spin casting solvent is one which can dissolve said novel polymers and any other additional optional components as noted above. This organic spin casting solvent may be a single solvent or a mixture of solvents. Suitable solvents are organic solvent which may include, for example, a glycol ether derivative such as ethyl cellosolve, methyl cellosolve, propylene glycol monomethyl ether (PGME), diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate (PGMEA); carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate (EL), ethyl glycolate, and ethyl-3-hydroxy propionate; a ketone ester such as methyl pyruvate or ethyl pyruvate; an alkyloxycarboxylic acid ester such as methyl 3-methoxypropionate, ethyl 3-ethoxypropionate, ethyl 2-hydroxy-2-methylpropionate, or methyl-ethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; a ketal or acetal like 1,3 dioxalane and diethoxypropane; lactones such as butyrolactone; an amide derivative such as dimethylacetamide or dimethylformamide, anisole, and mixtures thereof.

The novel compositions, in addition to the solvent, may contain surfactants as additives to facilitate coating.

Another aspect of said invention is novel compositions wherein said novel polymers comprise from about 0.1 wt % to about 2 wt % of the total weight of said composition including the organic spin casting solvent. In another aspect it comprises from about 0.1 wt % to about 1 wt %. In yet another embodiment it comprises from about 0.2 wt % to about 0.5 wt %. In yet another embodiment it comprises from about 0.2 wt % to about 0.3 wt %.

Another aspect of this invention is a process of forming a pining layer mat on a substrate comprising the steps;
 i) coating any one off said novel compositions describe herein, on a substrate forming a film,
 ii) baking said film at a temperature from about 200° C. to about 270° C. for about 1 to about 10 minutes forming a crosslinked pining layer MAT.

In one aspect of the above inventive process, step i) is done on a substrate selected from silicon, BARC, silicon BARC, and silicon dioxide.

In another aspect of this process, said pining layer MAT in step ii) has a thickness from about 5 nm to about 20 nm. In another aspect is has a thickens from about 7 nm to about 14 nm.

Another aspect of this invention is a chemoepitaxy process comprising the steps;
 ia) coating any one of said novel compositions, describe herein, on a substrate forming a film, iia) baking said film at a temperature from about 200° C. to about 315° C. for about 1 to about 10 minutes forming a crosslinked pinning layer MAT, iiia) patterning said crosslinked pinning layer MAT to form a patterned crosslinked pinning layer MAT, iva) coating on said patterned crosslinked pinning layer film with a neutral layer coating, va) curing said neutral layer coating and washing away with a solvent uncured neutral layer forming in areas of said substrate not covered by said patterned crosslinked pinning layer MAT, a neutral directing layer forming on said substrate forming a chemoepitaxy directing layer, via) coating on said chemoepitaxy directing layer a block copolymer solution forming a coating of block copolymer, viia) annealing said coating of block copolymer to form a directed self-assembled film of the block copolymer on said chemoepitaxy directing layer.

Another aspect of the above chemoepitaxy process, comprises, after viia), a step viiia) to affect a pattern transfer into said substrate:

viiia) using said self-assembled film of the block copolymer as a mask to pattern into the substrate with a plasma etch.

In another aspect of the chemoepitaxy process (comprising steps ia) to viia) or comprising steps ia) to viiia)) said substrate is a silicon BARC.

In another aspect of the chemoepitaxy process (comprising steps ia) to viia) or comprising steps ia) to viiia)) said block copolymer is a block copolymer of styrene and methyl methacrylate.

In another aspect of the chemoepitaxy processes, in step viia) the annealing of said coating of block copolymer may be done at a temperature of about 230° C. to about 260° C. for about 5 minutes to about 30 minutes.

In another aspect of the above pinning layer formation process or chemoepitaxy process, respectively, in steps ii) or iia) the temperature for effecting crosslinking of the coating of the novel polymers described herein may be from about 210° C. to about 260° C., or in another embodiment from about 220° C. to about 255° C. to about 260° C.

Similarly, in the above pinning layer formation process or chemoepitaxy process, the baking time in steps ii) or iia) may be also be varied in one embodiment from about 2 min to about 7 min, in another embodiment from about 2 min to about 5 min.

In the above embodiments of the invention wherein step viiia) follows step xiia) and the self-assembled bock copolymer domains are used to provide a selective barrier against etching into the substrate, this selectivity in etching may either be imparted by a differing reactivity of the assembled block domains towards a chemical etchant, or by a differing reactivity towards a plasma etching step, used to etch the substrate. One example is when one block is plasma etch resistant block and the other is highly etchable by the plasma. Selective etching into the substrate by the self-assembled block copolymer may be used to provide an image into the substrate. In turn this image may be used to in the manufacture of microelectronic devices by defining structures in specific layers employed in a process to make a memory or logic device.

To form said patterned crosslinked pinning layer MAT in above step iii), negative or positive resists may be coated on said crosslinked pinning layer MAT, imaged and developed and the resultant patterned resist used as an etch barrier to created said patterned crosslinked pinning MAT. The etching may be done from instance with a plasma, or by a chemical etching. For positive resist their tone is reversed to obtain a negative image instead of positive by using an organic solvent to develop instead of a TMAH-based developer. Also, the radiation used to form the photoresist pattern formed may be selected from e-beam, broadband, 193 nm immersion lithography, 13.5 nm, 193 nm, 248 nm, 365 nm and 436 nm radiation.

In general, but not bound by theory, when the substrate has a favorable interfacial energy with one domain than the other of a lamellar forming di-block copolymer, the interaction between the substrate and favorable domain causes the lamellar to be oriented parallel to the substrate in the thin film instead of perpendicular orientation. This parallel morphology of thin film has three typical structures such as asymmetric, symmetric and, hole and island structure depending on the BCP film thickness and the interfacial energy between the BCP domains and ambient environment (e.g., air or $N_2$). On a substrate grafted with polystyrene (PS), coated with the BCP and annealed in an $N_2$ atmosphere, both the PS domain and PMMA domain have the same interfacial energy. Consequently, both PS and PMMA domains can be located in an orientation parallel to the substrate surface.

Specifically, in the large areas stripped of neutral layer in the above described processes, on which a layer of the novel polystyrenic polymer can grafted on the bare substrate, this grafted layer produces a unexpectedly strong, dense and uniform pinning layers which may be used to avoid defect formation in these large areas which would occur for a diblock lamellar forming block copolymer of a styrenic (or other etch resistant polymer block of similar polarity to the novel grafted polystyrenic layer formed from the novel polymer) and aliphatic block (or other etchable polymer block of different polarity than the styrenic block). The formation of such an unexpectedly strong pinning layer produce a surface which is very favorable to a consistent parallel lamellar orientation of the block copolymer consistently over the entire large area with the grafted pinning layer. These parallel lamellar orientations give rise to a block copolymer coating which concomitant with its uniformity of orientation, during pattern etching, gives a consistent etching rate over the entire area. This uniformity of etching over large areas the block copolymer coating, prevents formation of defect areas of inconsistent etch rate. This would occur if the block copolymer coating, during self-assembly, formed self-assembled island or hole structures morphologies, which would otherwise occur at a substrate for a given coating of a lamellar forming di block copolymer, having a given Lo which would on a good pinning area form either asymmetric or symmetric structures having parallel lamellar orientations of the block copolymer domains. Thus, for the grafted pinning layer formed from the novel styrenic polymers there is formation of an unexpectedly strong and uniform pinning layer which leads in turn to a consistent formation of parallel lamellar formation over the entire large area which do not contain nanometer sized repeating patterns such as lines and spaces or trenches.

In the above described chemoepitaxy process, the block copolymer for use in conjunction with the novel polymer composition capable of forming a pinning layer can be any block copolymers which can form domains through self-assembly. The microdomains are formed by blocks of the same type which tend to self-associate. Typically, block copolymer employed for this purpose are polymers in which the repeat units derived from monomers are arranged in blocks which are different compositionally, structurally or both, and are capable of phase separating and forming domains. The blocks have differing properties which can be used to remove one block while keeping the other block intact on the surface, thus providing a pattern on the surface. Thus, the block may be selectively removed by plasma etching, solvent etching, developer etching using aqueous alkaline solution, etc. In block copolymers based on organic monomers, one block can be made from polyolefinic monomers including polydienes, polyethers including poly(alkylene oxides) such as poly(ethylene oxide), poly(propylene oxide), poly(butylene oxide) or mixtures thereof, and, the other block can be made from different monomers including poly((meth)acrylates), polystyrenes, polyesters, polyorganosiloxanes, polyorganogermanes, and or mixtures thereof. These blocks in a polymer chain can each comprise one or more repeat units derived from monomers. Depending on the type of pattern needed and methods used different types of block copolymers may be used. For instance, these may comprise diblock copolymers, triblock copolymers, terpolymers, or multiblock copolymers. The blocks of these block copolymers may themselves be comprised of homopolymers or copolymers. Block copolymers of different types may also be employed for self-assembly, such as dendritic block copolymers, hyperbranched block copolymers, graft block copolymers, organic diblock copolymers, organic multiblock copolymers, linear block copolymers, star block copolymers amphiphilic inorganic block copolymers, amphiphilic organic block copolymers or a mixture consisting of at least block copolymers of different types.

The blocks of organic block copolymer may comprise repeat units derived from monomers such as C-2 to C-30 olefins, (meth)acrylate monomers derived from C-1 to C-30 alcohols, inorganic-containing monomers including those based on Si, Ge, Ti, Fe, Al. Monomers based on C-2 to C-30 olefins can make up a block of high etch resistance alone or do so in combination with one other olefinic monomer. Specific example of olefinic monomers of this type are ethylene, propylene, 1-butene, 1,3-butadiene, isoprene, dihydropyran, norbornene, maleic anhydride, styrene, 4-hydroxy styrene, 4-acetoxy styrene, 4-methylstyrene, alpha-methylstyrene or mixtures thereof. Examples of highly etchable units can be derived from (meth)acrylate monomers such as (meth)acrylate, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, hydroxyethyl (meth)acrylate or mixtures thereof.

An illustrative example of a block copolymer containing one type of high etch resistant repeat unit would be a polystyrene block containing only repeat units derived from styrene and another type of highly etchable polymethylmethacrylate block containing only repeat units derived from methylmethacrylate. These together would form the block copolymer poly(styrene-b-methylmethacrylate), where b refers to block.

Non-limiting examples of block copolymers that are useful for graphoepitaxy, chemoepitaxy or pinned chemoepitaxy as used for directed self-assembly on a patterned substrate containing areas of patterned neutral layer, and areas of the patterned novel polystyrenic pinning layer are poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethyleneoxide-b-caprolactone), poly(butadiene-b-ethylene oxide), poly(styrene-b-t-butyl (meth)acrylate), poly (methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the above described block copolymers. All these polymeric materials share in common the presence of at least one block which is rich in repeat units resistant to etching techniques typically employed in manufacturing IC devices and at least one block which etches rapidly under these same conditions. This allows for the directed self-assembled polymer to pattern transfer onto the substrate to affect either pattern rectification or pattern multiplication.

Typically, the block copolymers employed for the directed self-assembly such as in graphoepitaxy, chemoepitaxy or pinned chemoepitaxy have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) of about 1.01 to about 6, or 1.01 to about 2 or 1.01 to about 1.5. Molecular weight, both $M_w$ and $M_n$, can be determined by, for example, gel permeation chromatography using a universal calibration method, calibrated to polystyrene standards. This ensures that the polymer blocks have enough mobility to undergo self-assembly when applied to a given surface either spontaneously, or by using a purely thermal treatment, or through a thermal process which is assisted by the absorption of solvent vapor into the polymer framework to increase flow of segments enabling self-assembly to occur.

Solvents suitable for dissolving block copolymers for forming a film can vary with the solubility requirements of the block copolymer. Examples of solvents for the block copolymer assembly include propylene glycol monomethyl ether acetate (PGMEA), ethoxyethyl propionate, anisole, ethyl lactate, 2-heptanone, cyclohexanone, amyl acetate, n-butyl acetate, methyl n-amyl ketone (MAK), gamma-butyrolactone (GBL), toluene, and the like as well as combinations thereof. In an embodiment, specifically useful casting solvents include propylene glycol monomethyl ether acetate (PGMEA), gamma-butyrolactone (GBL), or a combination of these solvents.

The block copolymer composition can comprise additional components and/or additives selected from the group of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

The block copolymer composition is applied on a patterned substrate containing areas of patterned neutral layer, and areas of the patterned novel polystyrenic pinning layer are defined on a surface by conventional lithography as described above, where the neutral layer surface is formed by a material as previously described and the pinning layer is formed the novel styrenic polymers described herein. Upon application and solvent removal, the block copolymer then undergoes self-assembly directed by the specific pattern formed by conventional lithographic processing over the neutral layer through a patterned chemical difference of the substrate surface created by conventional lithographic process. Either pattern rectification maintaining the same resolution is achieved and/or pattern multiplication may also be achieved if multiple phase boundaries are formed between the features defined with conventional lithography, depending on the relative pitch of the pattern versus the microphase separation distance after standard IC processing to pattern transfer.

The application of the block copolymer by spinning techniques (including spin drying) can suffice to form the self-directed block copolymer assembly. Other methods of self-directed domain formation can occur during applying, baking, annealing, or during a combination of one or more of these operations. In this way, an oriented block copolymer assembly is prepared by the above method, having microphase-separated domains that comprise cylindrical microdomains oriented perpendicular to the neutral surface, or that comprise lamellar domains oriented perpendicular to the neutral surface. Generally, the microphase-separated domains are lamellar domains oriented perpendicular to the neutral surface, which provide parallel line/space patterns in the block copolymer assembly. The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface to give highly resistant and highly etchable regions on the surface of the substrate which can be further pattern transferred in the substrate layers. The directed self-assembled block copolymer pattern is transferred into the underlying substrate using known techniques. In one example, wet or plasma etching can be used with optional UV exposure. Wet etching can be with acetic acid. Standard plasma etch process, such as a plasma comprising oxygen may be used; additionally, argon, carbon monoxide, carbon dioxide, $CF_4$, $CHF_3$ may be present in the plasma.

In the present invention, the initial negative tone photoresist pattern used for forming the directed self-assembly pattern can be defined using either negative or positive photoresists, in negative tone development processes, and imagable using any conventional lithographic techniques, such as e-beam, ion beam, x-ray, EUV (13.5 nm), broadband, or UV (450 nm-10 nm) exposure, immersion lithography, etc. In one embodiment, the present invention is particularly useful for 193 nm imagewise exposure using either dry lithography or immersion lithography. For 193 nm lithography a commercially available positive 193 nm photoresist can be employed such as the non-limiting example of AZ AX2110P (available from EMD Performance Materials Corp, Somerville, N.J.), photoresist from Shin-Etsu Chemical Corp., JSR Micro from Japan Synthetic Rubber, and other photoresists available from Fujifilm, TOK, etc. These photoresists may be developed after exposure, and post exposure baked using an aqueous alkaline developer comprising tetramethylammonium hydroxide to give a positive tone pattern or developed using an organic solvent such as methyl n-amyl ketone (MAK), n-butyl acetate, anisole, etc. to give a negative tone pattern. Alternatively, also for 193 nm exposure, commercially available negative tone photoresists may be employed.

The substrate usable with these inventive coating and chemoepitaxy process are any required in the manufacture of an IC device. In one example, the substrate is a wafer coated with a layer of high carbon content organic layer with a coating of silicon or titanium containing ARC (high etch resistance to oxygen plasma) over it, which allows pattern transfer of the patterned block copolymer into these coatings. Suitable substrates include, without limitation, silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group III/V compounds. These substrates may be coated with antireflective coating(s). The substrate may comprise any number of layers made from the materials described above.

For the present invention, a variety of processes involving pinned chemoepitaxy may be employed to achieve a directed self-assembly of the aforementioned block copolymer using along with the novel styrenic polymer composition known neutral layers as described in U.S. Pat. Nos. 8,835,581, 9,181,449, 9,093,263, 8,691,925, US20140335324A1, US2016-0122579A1 or U.S. application Ser. No. 14/885,328, which are all incorporated herein by reference in their entirety. This pattern can then be further transferred into the substrate. In this manner, a variety of high-resolution features may be pattern transferred into the substrate achieving either pattern rectification, pattern multiplication or both.

It was found that compositions containing standard styrenic crosslinking polymer are prone to the formation of defects during coating and crosslinking on hydrophobic substrates. Specifically, it was found that the copolymer of tBuS and VBCB, which despite forming good crosslinked coating on SiOx and SiN substrates was found to give to give many defects and poor adhesion when coated on the hydrophobic substrate SiBARC. However, the novel polymers described herein, when formulated in a spin casting solvent and coated on SiBARC, worked efficiently. Additionally, these novel compositions could still be coated and crosslinked on oxide and nitride substrates such as SiOx and SiN forming crosslinked MAT layers with low significant defect levels. The novel polymers described herein, which were comprised of 4-tert-butylstyrene (tBuS), 4-vinylbenzocyclobutene (VBCB), and 4-hydroxystyrene (HOS). An improvement in the composition to P(tBuS-VBCB-HOS) [i.e., poly(4-tert-butylstyrene-co-4-vinylbenzobcyclobutene-co-4-hydroxystyrene)] gave a hydrophobic crosslinking pinning MAT with low coating defects. Although not bound by theory, it is believed that a synergistic effect occurs when tBuS repeat unit, which makes the polymer more hydrophobic, is combined with the crosslinking VBCB repeat unit and the HOS repeat which may make the polymer more compatible with the SiBARC substrate. This low defect level will enable better processing of chemoepitaxy block copolymer (BCP) guide patterns

EXAMPLES

Reference will now be made to more specific embodiments of the present disclosure and experimental results that provide support for such embodiments. However, the disclosure below is for illustrative purposes only and is not intended to limit the scope of the claimed subject matter in any way.

Polymer molecular weights were determined with a Water 2695 Alliance Module gel permeation chromatograph (Waters Corporation, 34 Maple Street, Milford, Mass.), provided with one Shodex KF-801, two KF-802, one KF-804 columns and dual ultraviolet detector (Model 2487) and differential refractometry detector (Mode 2414). The solvent used was tetrahydrofuran flowing at 0.7 mL/min at 40° C. and the calibration was carried out with standard polystyrene samples.

All chemicals were obtained from Millipore Sigma, (Billerica Ma).

Lithographic Exposures were done with a Hamamatsu Photonics (250 Wood Avenue Middlesex, N.J. 08846), EX-mini. Etching Experiments were done with a Nordson March (300 Nordson Dr. M/S 47 Amherst, Ohio 44001 U.S.A.) RIE-1700. Spinning and development of films and patterns was done with a Litho Tech Japan (Litho Tech Japan Corporation 2-6-6-201 Namiki, Kawaguchi-shi, Saitama, 3320034, Japan), LARC1012 or a SOKUDO (5th Fl. K•I Shijo Building, 88 Kankobokocho, Shijodori-Muromachi-Higashiiru, Shimogyo-ku, Kyoto, 600-8009, Japan) DUO track. Scanning Electron Micrographs were obtained with an AMAT SEM (Applied Materials, Inc. 3050 Bowers Avenue, P.O. Box 58039 Santa Clara, Calif. 95054-3299 U.S.A.). A Hitachi S-5500 (Hitachi High Technologies America Inc. 10 North Martingale Road, Suite 500 Schaumburg, Ill. 60173-2295) was used to examine cross sections SEM of Via arrays produced. Contact angles were measured using a Kyowa (Kyowa Interface Science Co., Ltd. 5-4-41 Nobitome, Niiza-City, Saitama 352-0011, Japan) Interface Science Drop Master DY-700.

General Procedure for the Synthesis of Poly(4-tert-butylstyrene-co-4-vinylbenzocyclobutene-co-4-acetoxystyre

4-tert-Butylstyrene, 4-vinylbenzocyclobutene, 4-acetoxystyrene, azoisocyanopropylnitrile, and 2-butanone were added into a flask and purged with nitrogen for 30 min and kept in a nitrogen atmosphere. The mixture was heated in a 90° C. oil bath for 20 hours.

General Procedures for the Synthesis of Poly(4-tert-butylstyrene-co-4-vinylbenzocyclobutene-co-4-hydroxystyrene)

Two different procedures were used to remove the acetoxy moiety of poly(4-tert-butylstyrene-co-4-vinylbenzocyclobutene-co-4-acetoxystyrene) to yield poly(4-tert-butylstyrene-co-4-vinylbenzocyclobutene-co-4-hydroxystyrene). In one procedure 12N HCl (10 eq.) in methanol MeOH (10 eq.) was added to the mixture above and this was refluxed for 3 hours. Alternatively, 25% Tetramethylammonium hydroxide in MeOH (3 eq. based on Ac moles) was added to the mixture above and stirred at room temperature for 16 hours. The hydrolyzed mixture was diluted with THF and precipitated into MeOH. The precipitate was isolated, dissolved in THF, and precipitated in MeOH. The polymer was dried by vacuum.

Scheme 1 outlines the two procedures described above as follows:

Scheme 1

Synthetic Example 1 (Synthesis of (tBuS/VBCB/HOS)(85/10/5 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $1.69 \times 10^{-3}$ moles, 0.28 g), tert-butylstyrene (tBuS, 0.15 moles, 24.00 g), 4-vinylbenzocyclobutene (VBCB, 0.018 moles, 2.29 g), 4-acetoxystyrene (AcOS, 0.009 moles, 1.43 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled to room temperature, then TMAH, 25% in MeOH ($6.00 \times 10^{-3}$ moles, 2.53 mL) was added and stirred for 4 hours. The mixture was acidified to pH1 with 3N HCl, then slowly precipitated in MeOH (0.7 L). The precipitate was collected by vacuum filtration and oven dried. The residue was re-dissolved in TH (15% solids) and precipitated in MeOH (0.7 L) once again. The precipitate was collected by vacuum filtration and oven dried.

The polymer is an off-white solid, 17.48 g (64.4% yield). GPC: $M_n$: 15,893 g/mol; $M_w$: 26,738 g/mol; PD: 1.69.

Synthetic Example 2: Synthesis of (tBuS/VBCB/HOS) (85/10/5 Feed)

In a 2 L 4-neck round bottomed flask equipped with a mechanical stir shaft, a reflux condenser, a temperature controller and a nitrogen sparging tube, 2,2'-azobis(2-methylpropionitrile) (AIBN, 0.018 moles, 2.96 g), tert-butylstyrene (tBuS, 1.281 moles, 205.21 g), 4-vinylbenzocyclobutene (VBCB, 0.151 moles, 19.61 g), 4-acetoxystyrene (AcOS, 0.075 moles, 12.22 g), and 2-butanone (MEK, 360 g) were added. The reaction mixture was stirred while nitrogen was sparged in for 1.0 hour. The mixture was slowly heated in a heating mantle to 75° C. and stirred for 20 hours. The mixture was cooled to room temperature, then TMAH, 25% in MeOH (0.075 moles, 31.71 mL) was added and stirred for 4 hours. The mixture was acidified to pH1 with 3N HCl, then slowly precipitated in MeOH (8 L). The precipitate was collected by vacuum filtration and oven dried. The residue was re-dissolved in THE (15% solids) and precipitated in MeOH (8 L) once again. The precipitate was collected by vacuum filtration and oven dried.

The polymer is an off-white solid, 165.76 g (69.5% yield). GPC: $M_n$: 14,990 g/mol; $M_w$: 25,332 g/mol; PD: 1.69.

Synthetic Example 3: Synthesis of (tBuS/VBCB/HOS) (85/10/5 Feed)

The procedure was followed as above. The polymer is an off-white solid, 166.40 g (69.8% yield). GPC: $M_n$: 14,939 g/mol; $M_w$: 25,374 g/mol; PD: 1.70.

Synthetic Example 4: Synthesis of (tBuS/VBCB/HOS) (85/10/5 Feed)

The polymerization was followed as in Synthesis Example 1. The hydrolysis was done adding 12N HCl (10.5 g) in MeOH (10 g) at the end of 16 hours. The mixture was heated for 4 hours, cooled, then precipitated in MeOH (0.7 L). The precipitate was collected by vacuum filtration and oven dried. The residue was re-dissolved in THF (15% solids) and precipitated in MeOH (0.7 L) once again. The precipitate was collected by vacuum filtration and oven dried.

The polymer is an off-white solid, 19.22 g (68.6% yield). GPC: $M_n$: 16,452 g/mol; $M_w$: 27,347 g/mol; PD: 1.66.

Synthetic Example 5: Synthesis of (tBuS/VBCB/HOS) (80/15/5 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $2.52 \times 10^{-3}$ moles, 0.41 g), tert-butylstyrene (tBuS, 0.14 moles, 22.69 g), 4-vinylbenzocyclobutene (VBCB, 0.027 moles, 3.46 g), 4-acetoxystyrene (AcOS, 0.009 moles, 1.44 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled to room temperature, then TMAH, 25% in MeOH ($6.00 \times 10^{-3}$ moles, 2.53 mL) was added and stirred for 4 hours. The mixture was acidified to pH1 with 3N HCl, then slowly precipitated in MeOH (0.7 L). The precipitate was collected by vacuum filtration and oven dried. The residue was re-dissolved in TH (15% solids) and precipitated in MeOH (0.7 L) once again. The precipitate was collected by vacuum filtration and oven dried.

The polymer is an off-white solid, 16.2 g (68.9% yield). GPC: $M_n$: 16,106 g/mol; $M_w$: 27,388 g/mol; PD: 1.70.

Example 6: Synthesis of (tBuS/VBCB/HOS) (80/10/10 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $1.69 \times 10^{-3}$ moles, 0.28 g), tert-butylstyrene (tBuS, 0.14 moles, 22.57 g), 4-vinylbenzocyclobutene (VBCB, 0.018 moles, 2.29 g), 4-acetoxystyrene (AcOS, 0.018 moles, 2.86 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled to room temperature, then TMAH, 25% in MeOH (0.012 moles, 5.05 mL) was added and stirred for 4 hours. The mixture was acidified to pH1 with 3N HCl, then slowly precipitated in MeOH (0.7 L). The precipitate was collected by vacuum filtration and oven dried. The residue was re-dissolved in TH (15% solids) and precipitated in MeOH (0.7 L) once again. The precipitate was collected by vacuum filtration and oven dried.

The polymer is an off-white solid, 17.16 g (64.0% yield). GPC: $M_n$: 15,592 g/mol; $M_w$: 27,772 g/mol; PD: 1.78.

Example 7: Synthesis of (tBuS/VBCB/HOS) (85/10/5 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $2.93 \times 10^{-3}$ moles, 0.48 g), tert-butylstyrene (tBuS, 0.149 moles, 23.82 g), 4-vinylbenzocyclobutene (VBCB, 0.018 moles, 2.28 g), 4-acetoxystyrene (AcOS, 0.009 moles, 1.42 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled to room temperature, then TMAH, 25% in MeOH (0.009 moles, 3.68 mL) was added and stirred for 4 hours. The mixture was acidified to pH1 with 3N HCl, then slowly precipitated in MeOH (0.7 L). The precipitate was collected by vacuum filtration and oven dried. The residue was re-dissolved in TH (15% solids) and precipitated in MeOH (0.7 L) once again. The precipitate was collected by vacuum filtration and oven dried.

The polymer is an off-white solid, 17.65 g (77.7% yield). GPC: $M_n$: 10,729 g/mol; $M_w$: 18,160 g/mol; PD: 1.69.

Example 8: Synthesis of Poly(4-tert-butylstyrene-co-4-vinylbenzocyclobutene-co-glycidyl methacrylate) (tBuS/VBCB/GMA) (87/8/5 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $1.69 \times 10^{-3}$ moles, 0.28 g), tert-butylstyrene (tBuS, 0.153 moles, 24.47 g), 4-vinylbenzocyclobutene (VBCB, 0.014 moles, 1.83 g), 4-acetoxystyrene (AcOS, 0.009 moles, 1.42 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled to room temperature, then TMAH, 25% in MeOH (0.009 moles, 3.68 mL) was added and stirred for 4 hours. The mixture was acidified to pH1 with 3N HCl, then slowly precipitated in MeOH (0.7 L). The precipitate was collected by vacuum filtration and oven dried. The residue was re-dissolved in TH (15% solids) and precipitated in MeOH (0.7 L) once again. The precipitate was collected by vacuum filtration and oven dried.

The polymer is an off-white solid, 18.20 g (65.3% yield). GPC: $M_n$: 15,325 g/mol; $M_w$: 28,669 g/mol; PD: 1.87.

Example 9: Poly(4-tert-butylstyrene-co-4-vinylbenzocyclobutene-co-4-vinylbenzoic Acid) Synthesis of (tBuS/VBCB/VBA) (85/10/5 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $1.69 \times 10^{-3}$ moles, 0.28 g), tert-butylstyrene (tBuS, 0.150 moles, 24.11 g), 4-vinylbenzocyclobutene (VBCB, 0.018 moles, 2.30 g), 4-vinylbenzoic acid (VBA, 0.009 moles, 1.31 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled, then slowly precipitated in MeOH (0.7 L). The precipitate was collected by vacuum filtration and oven dried. The residue was re-dissolved in THE (15% solids) and precipitated in MeOH (0.7 L) once again. The precipitate was collected by vacuum filtration and oven dried.

The polymer is an off-white solid, 18.58 g (66.4% yield). GPC: $M_n$: 21,428 g/mol; $M_w$: 39,534 g/mol; PDI: 1.85.

Example 10: Poly(4-tert-butylstyrene-co-4-vinyl-benzocyclobutene-co-glycidylmethacrylate) Synthesis of (tBuS/VBCB/GMA) (85/10/5 Feed)

In a 250 mL 4-neck round bottomed flask equipped with a stir bar, a reflux condenser, a temperature controller and a nitrogen sparging tube, 2,2'-azobis(2-methylpropionitrile) (AIBN, $1.69 \times 10^{-3}$ moles, 0.28 g), tert-butylstyrene (tBuS, 0.151 moles, 24.15 g), 4-vinylbenzocyclobutene (VBCB, 0.018 moles, 2.31 g), glycidyl methacrylate (GMA, 0.009 moles, 1.26 g), and 2-butanone (MEK, 42 g) were added. The reaction mixture was stirred while nitrogen was sparged in for 1.0 hour. The mixture was heated in a 90° C. oil bath and stirred for 20 hours. The mixture was cooled, then slowly precipitated in MeOH (0.7 L). The precipitate was collected by vacuum filtration and oven dried. The residue was re-dissolved in THE (15% solids) and precipitated in MeOH (0.7 L) once again. The precipitate was collected by vacuum filtration and oven dried.

The polymer is an off-white solid, 20.86 g (74.5% yield). GPC: $M_n$: 16,852 g/mol; $M_w$: 30,909 g/mol; PDI: 1.83.

Comparative Example 1: Synthesis of Poly(styrene-co-4-vinylbenzocyclobutene) (93/7 Feed)

In a 250 mL 4-neck round bottomed flask equipped with a stir bar, a reflux condenser, a temperature controller and a nitrogen sparging tube, 2,2'-azobis(2-methylpropionitrile) (AIBN, 0.063 moles, 10.35 g), styrene (S, 6.05 moles, 630 g), 4-vinylbenzocyclobutene (VBCB, 0.456 moles, 59.3 g), and 2-butanone (MEK, 1050 g) were added. The reaction mixture was stirred while nitrogen was sparged in for 1.0 hour. The mixture was heated in a 90° C. oil bath and stirred for 20 hours. The mixture was cooled, then slowly precipitated in iPrOH (15 L). The precipitate was collected by vacuum filtration and oven dried. The residue was re-dissolved in TH (15% solids) and precipitated in MeOH (15 L) once again.

The precipitate was collected by vacuum filtration and oven dried. The polymer is an off-white solid, 450 g (64.0% yield). GPC: $M_n$: 9,452 g/mol; $M_w$: 18,053 g/mol; PDI: 1.91.

Characterization

Figure 1:
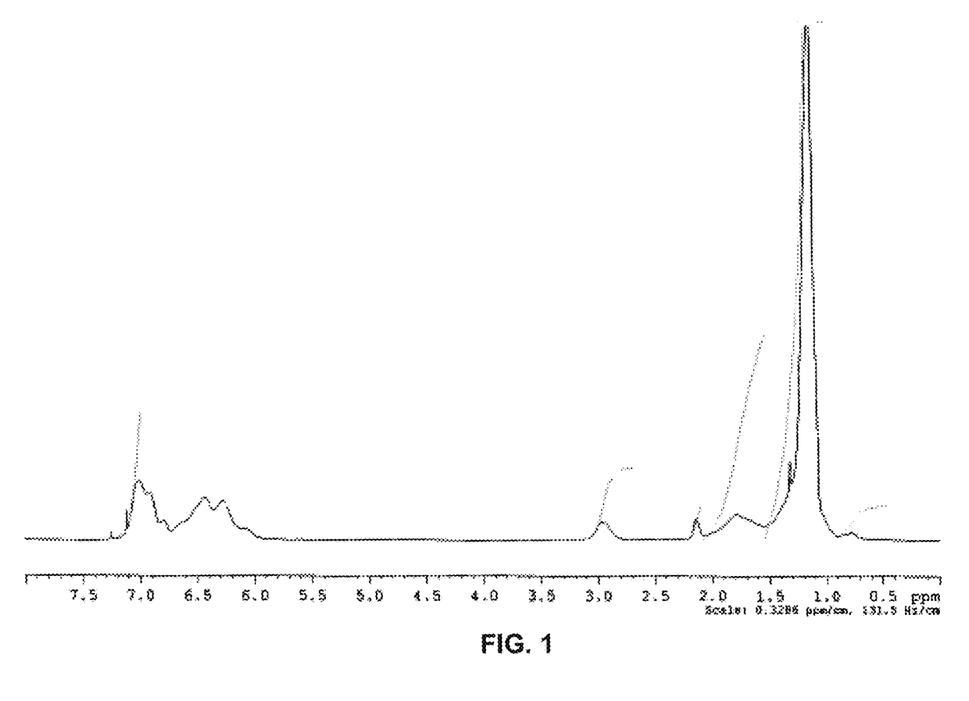
FIG. 1: H-1 NMR of P(tBuS-co-VBCB-co-AcOS)

FIG. 1 shows a representative H-1 NMR spectrum of the polymer P(tBuS-co-VBCB-co-AcOS). The calculation of composition was done as follows: The VBCB cyclobutane integration at 2.97 ppm was divided by 4 protons to give the integration per mole for VBCB. The acetyl integration at 2.14 ppm was divided by 3 protons to give the integration per mole of AcOS. The VBCB integration per mole was multiplied by 3 protons and subtracted from the aromatic integration at 6.0-7.5 ppm. The AcOS integration per mole was multiplied by 4 protons and subtracted from the aromatic integration at 6.0-7.5 ppm. The remaining aromatic integration was divided by 4 protons to give the integration per mole of tBuS. The mole % composition can be calculated by each monomer's contribution.

Figure 2:
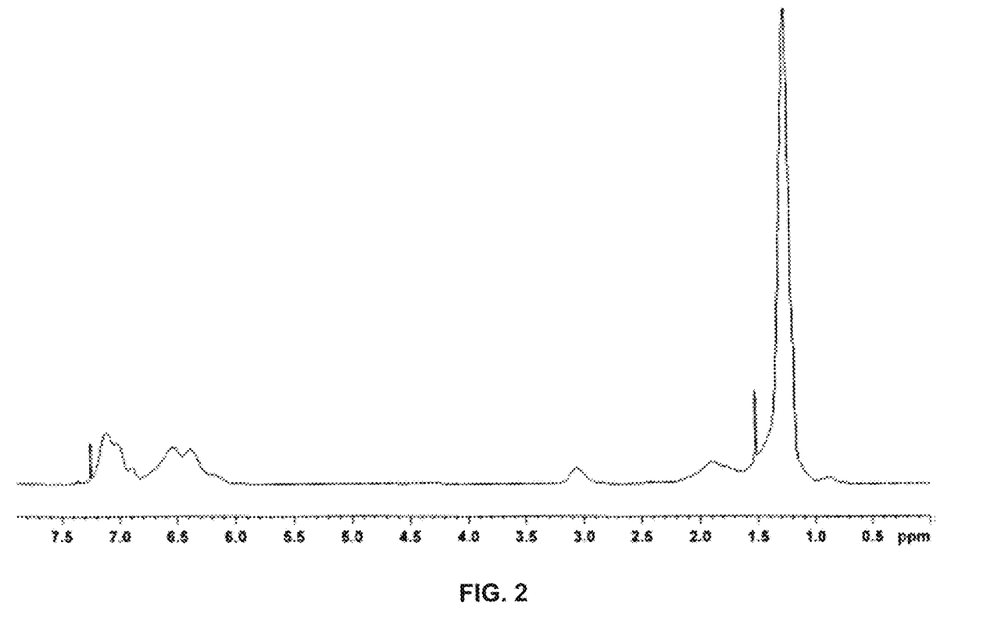
FIG. 2: H-1 NMR of P(tBuS-co-VBCB-co-HOS)

FIG. 2 shows a representative H-1 NMR spectrum of the polymer P(tBuS-co-VBCB-co-HOS). The conversion of AcOS to HOS is characterized by the hydrolysis of the peak at 2.14 ppm (the absence of the peak from FIG. 1).

Figure 3:
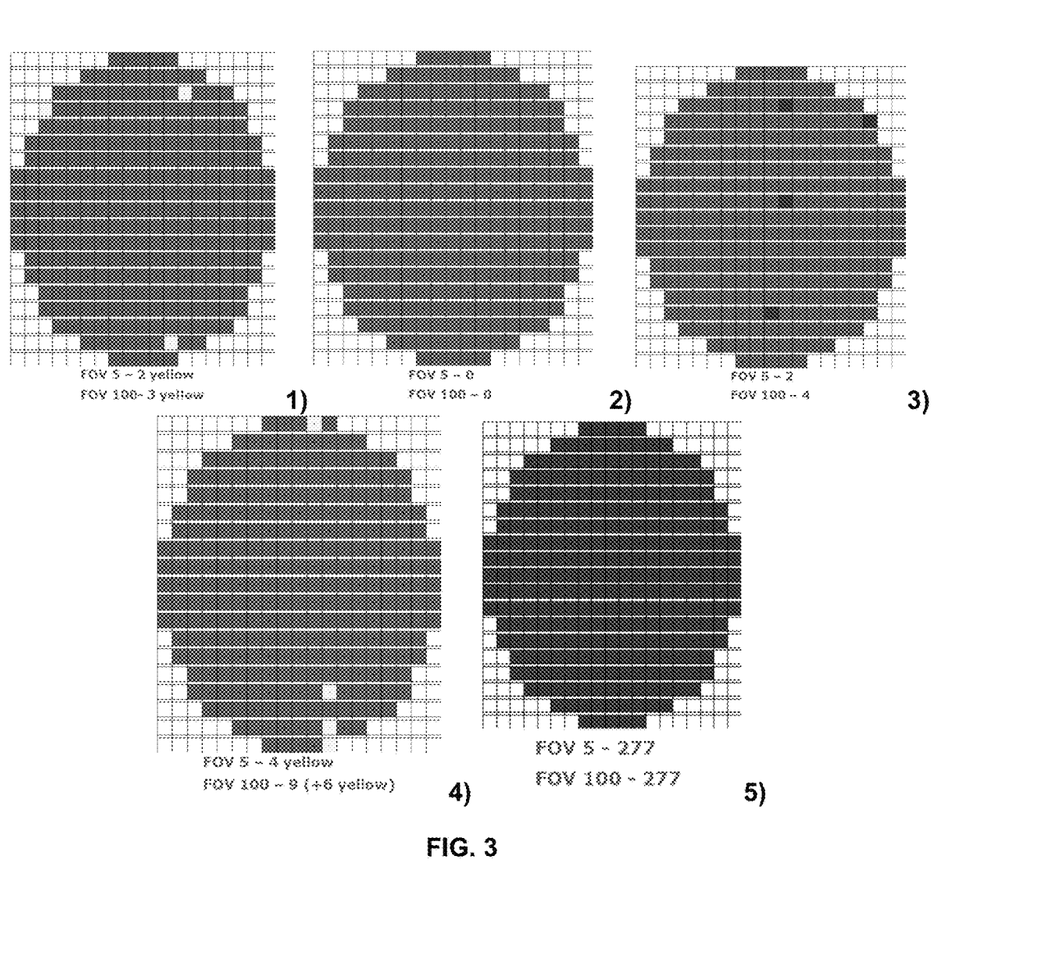
FIG. 3: Coating defect analyses by LPC:
1) P(tBuS-co-VBCB-co-HOS) (80/15/5), (Example 5, 26.5 k g/mole, 1.755 PDI);
2) P(tBuS-co-VBCB-co-HOS) (85/10/5), (Example 1, 26.7 k g/mole, 1.752 PDI);
3) P(tBuS-co-VBCB-co-HOS) (80/10/10), (Example 6, 27.8 k g/mole, 1.781 PDI);
4) P(tBuS-co-VBCB-co-HOS) (85/10/5), (Example 8, 18.2 k g/mole, 1.693 PDI); 5) P(S-co-VBCB) (93/7), (Comparative Example 1)

Table 1 shows a summary of the characterization data for the polymers prepared in Examples 1 to 10 and that of comparative Example 1 ($M_w$ and polydispersity (PDA)). Additionally, this Table also summarizes water contact angle (CA), and the performance of pinning layer on SiN prepared from formulations prepared from these Examples (see processing conditions). These formulations each prepared from the corresponding synthetic Example (a.k.a. Examples 1 to 10 and Comparative Example 1, corresponds to Formulation Example 1 to 10 and Comparative Formulation Example 1) were prepared by dissolving these materials as a 0.3 wt % solution in PGMEA which was filtered through a Nylon 0.01 um filter. Similar results were observed when coating these pinning layer on SiOx.

TABLE 1

| | \multicolumn{6}{c}{P(tBuS-co-VBCB-co-HOS) - Polymer and Pinning Film Characterization Summary} | | | | | |
|---|---|---|---|---|---|---|
| Functionality (feed mole %) | Synthetic/ Formulation Comparative. Example 1 FIG. 3-> 5) | Synthetic/ Formulation Example 5 FIG. 3-> 1) | Synthetic/ Formulation Example 1 FIG. 3-> 2) | Synthetic/ Formulation Example 6 FIG. 3-> 3) | Synthetic/ Formulation Example 7 FIG. 3-> 4) | Synthetic/ Formulation Example 8 |
| S | 93 | 0 | 0 | 0 | 0 | 0 |
| tBuS | 0 | 80 | 85 | 80 | 85 | 87 |
| VBCB | 7 | 15 | 10 | 10 | 10 | 8 |
| HOS | 0 | 5 | 5 | 10 | 5 | 5 |
| $M_w$ of polymer | 18,500 | 26,491 | 26,738 | 27,772 | 18,160 | 26,669 |
| PDA | 1.9 | 1.755 | 1.752 | 1.781 | 1.693 | 1.871 |
| | Formulation Properties of Pinning Film FIG. 3-> 5) | Formulation Properties of Pinning Film FIG. 3-> 1) | Formulation Properties of Pinning Film FIG. 3-> 2) | Formulation Properties of Pinning Film FIG. 3-> 3) | Formulation Properties of Pinning Film FIG. 3-> 4) | Formulation Properties of Pinning Film |
| CA | 79 | | | | 88 | 88-89 |
| Uniformity/XL | Dewet | Good | Good | Good | Good | Good |

TABLE 1-continued

P(tBuS-co-VBCB-co-HOS) - Polymer and Pinning Film Characterization Summary

| Neutrality | No | No | No | No | No | No |
|---|---|---|---|---|---|---|
| Defects 100/5 | 277/277 | 20/0 | 0/0 | 4/2 | 0(17)/1 | 1(3)/0 |

Performance Analysis & Processing Conditions:

All layers were coated at 1500 RPM. CoatSiARC (ShinEtsu SB-A940-L35), bake at 220° C./90 s, coat, bake 250° C./5 min in $N_2$, coat (PS-b-PMMA, 53/47, 30 nm Lo, see below), bake 250° C./5 min in $N_2$.

Synthesis of Block Copolymer of Styrene and Methyl Methacrylate (PS-b-PMMA, 53/47)

Two different PS-b-PMMA (PS/PMMA: 53:47) polymers were synthesized via sequential living anionic polymerization of styrene (S) and methyl methacrylate (MMA) in tetrahydrofuran (THF) as a solvent using sec-butyllithium (1.4 M, Aldrich) as an initiator. The reaction was performed at –78° C. in the presence of LiCl (high purity, Aldrich) under purified argon environment. The feed ratio of monomers was used to obtain a 51/49 mole ratio polymers and the low and high molecular weight 51/49 PS-b-PMMA polymers were made by respectively using 0.142 mole % and 0.062 mole % of initiator versus total moles of monomer. The molecular weight in a PS-b-PMMA were characterized by size-exclusion chromatography (SEC). The number-averaged molecular weight (M) for low molecular weight and high molecular weight BCP were 40,500 g/mole and 74,000 g/mole, respectively with both having a PDI of 1.02. The PS mole % determined by 1H NMR for the low and high molecular weight BCP were respectively 53.3 and 52.0% respectively. These two samples were used for line-space self-assembly either as a single BCP or by blending of these two.

Defect Analyses:

Wafers were scanned on an Applied Materials NanoSem 3D tool with a procedure to collect 277 images for two fields of view (FOV5 & FOV100). FIG. 3 shows an example of this scan wherein defects are calculated with either a Field of View (FOV) of either 5 or 100 microns. In FIG. 3 defect images were evaluated as de-wet spots, black dots or white dots (marked in dark grey ■). Questionable small defects were marked in light grey. Areas with no detectable defects were marked in grey ■.

The film evaluated for defect counts as shown in Table 1 and FIG. 3 were coating films 1) through 5) which were coated and crosslinked from the following Synthetic examples: Coating 1): P(tBuS-co-VBCB-co-HOS) (80/15/5), (Example 5) (6.5 k g/mole, 1.755 PDI)
Coating 2:) P(tBuS-co-VBCB-co-HOS) (85/10/5), (Example 1) (26.7 k g/mole, 1.752 PDI)
Coating 3): P(tBuS-co-VBCB-co-HOS) (80/10/10), (Example 6) (27.8 k g/mole, 1.781 PDI)
Coating 4): P(tBuS-co-VBCB-co-HOS) (85/10/5), (Example 7) (18.2 k g/mole, 1.693 PDI)
Coating 5): P(S-co-VBCB) (93/7), (Comparative Example 1):

As can was seen in FIG. 3, and Table 1, Coating 5), which was prepared from comparative Example 1, P(S-co-VBCB) had a much higher defect counts and showed extensive adhesion loss, which is in contrast to all the coating from of P(tBuS-co-VBCB-co-HOS) tested, "1) through 4)," which gave few of this novel pinning mat, prepared from a composition comprising this pinning mat has much better pinning capability than a pinning mat prepared from Comparative Example 1.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

I claim:

1. A polymer comprised of the repeat units of structures (I), (II), and (III), wherein R1, R2 and R3 are individually selected from H or a C-1 to C-4 linear alkyl, $R_5$, $R_7$ and $R_6$ are individually selected from a C-1 to C-8 linear alkyl, a C-3 to C-8 linear alkyl and a C-3 to C-8 cyclic alkyl;

2. The polymer of claim 1, wherein each polymer chain of said polymer contains one hydrogen end group and one end group having structure (IV),
   wherein $R_8$ and $R_9$ are individually selected from a C-1 to C-8 linear alkyl, a C-3 to C-8 branched alkyl and a C-3 to C-8 cyclic alkyl,
   wherein * designates the attachment point of said end group of structure (IV) to said polymer chain,
   wherein X is CN or a carbonyloxyalkyl of structure (—C(=O)—O—$R_{10}$), and wherein $R_{10}$ is selected from a C-1 to C-8 linear alkyl, a C-3 to C-8 branched alkyl and a C-3 to C-8 cyclic alkyl (IV)

3. The polymer of claim 1, wherein $R_1$, $R_2$ and $R_3$ are H.

4. The polymer of claim 1, wherein any two of $R_5$, $R_6$ and $R_7$ are linked together forming a single C-6 to C-24 alkyl-cycloalkan-1-yl moiety, or wherein all three of $R_5$, $R_6$ and $R_7$ are linked together to form a C-6 to C-24 tertiary alicyclic moiety.

5. The polymer of claim 1, wherein $R_5$, $R_6$ and $R_7$ are each independently selected from a from a C-1 to C-8 linear alkyl, a C-3 to C-8 linear alkyl and a C-3 to C-8 cyclic alkyl.

6. The polymer of claim 1, wherein $R_5$, $R_6$ and $R_7$ are each independently selected from a C-1 to C-8 linear alkyl.

7. The polymer of claim 2, wherein said end group of structure (IV) is one wherein X is CN.

8. The polymer of claim 2, wherein said end group of structure (IV) is one wherein X is CN and $R_8$ and $R_9$ are each independently selected from a C-1 to C-8 linear alkyl.

9. The polymer of claim 2, wherein said end group of structure (IV) is one wherein X is CN and $R_8$ and $R_9$ are methyl.

10. The polymer of claim 1, wherein the mole % value of repeat unit of structures (I) ranges from about 1 mole % to about 15 mole % of said polymer,
wherein the mole % value of repeat unit of structure (II) ranges from about 5 mole % to about 30 mole % of said polymer, wherein repeat unit of structure (III) ranges from about 75 mole % to about 90 mole % of said polymer and
wherein the sum of the mole % values of the repeat units of structure (I), (II) and (III) add up to 100 mole % of the total moles of repeat units of said polymer.

11. The polymer of claim 1, wherein the mole % value of repeat unit of structures (I) ranges from about 5 mole % to about 10 mole %,
wherein the mole % value of repeat unit of structure (II) ranges from about 7 mole % to about 15 mole % of said polymer,
wherein repeat unit of structure (III) ranges from about 80 mole % to about 87 mole % of said polymer and
wherein the sum of the mole % values of the repeat units of structure (I), (II) and (III) add up to 100 mole % of the total moles of repeat units of said polymer.

12. A composition comprising said polymer of claim 1 and a spin casting solvent.

13. The composition of claim 12, wherein the wt % of said polymer is from about 0.2 wt % to about 0.3 wt %.

14. A process of forming a pining layer mat on a substrate comprising the steps;
coating said composition of claim 12 on a substrate forming a film, and
baking said film at a temperature from about 200° C. to about 270° C. for about 1 to about 10 minutes forming a pining layer MAT.

15. The process according to claim 14 wherein said substrate is a silicon BARC.

16. A chemoepitaxy process comprising the steps;
ia) coating said composition of claim 12 on a substrate forming a film,
iia) baking said film at a temperature from about 200° C. to about 315° C. for about 1 to about 10 minutes forming a crosslinked pinning layer MAT,
iiia) patterning said crosslinked pinning layer MAT to form a patterned crosslinked pinning layer MAT,
iva) coating on said patterned crosslinked pinning layer MAT a neutral layer coating,
va) curing said neutral layer coating and washing away with a solvent uncured neutral layer forming in areas of said substrate not covered by said patterned crosslinked pinning layer MAT, a neutral directing layer forming on said substrate forming a chemoepitaxy directing layer,
via) coating on said chemoepitaxy directing layer a block copolymer solution forming a coating of block copolymer,
viia) annealing said coating of block copolymer to form a directed self-assembled film of the block copolymer on said chemoepitaxy directing layer.

17. The chemoepitaxy process of claim 16, further comprising step viiia):
viiia) using said self-assembled film of the block copolymer as a mask to pattern into the substrate with a plasma etch.

18. The chemoepitaxy process of claim 16, wherein said substrate is a silicon BARC.

19. The chemoepitaxy process of claim 16, wherein said block copolymer is a block copolymer of styrene and methyl methacrylate.

* * * * *